United States Patent
Liu et al.

(10) Patent No.: US 6,559,018 B1
(45) Date of Patent: May 6, 2003

(54) SILICON IMPLANT IN A SALICIDED COBALT LAYER TO REDUCE COBALT-SILICON AGGLOMERATION

(75) Inventors: Chi-Kang Liu, Hsin-Chu (TW); Tien-Chi Ke, Pan-Chiao (TW); Hsin-Li Cheng, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/053,308

(22) Filed: Jan. 18, 2002

(51) Int. Cl.$^7$ .............................................. H01L 21/425
(52) U.S. Cl. ...................... 438/303; 438/528; 438/592; 438/683
(58) Field of Search ................................ 438/303, 305, 438/407, 528, 592, 683, 918

(56) References Cited

U.S. PATENT DOCUMENTS

| | | | |
|---|---|---|---|
| 5,536,684 A | * 7/1996 | Dass et al. | 437/201 |
| 5,624,869 A | 4/1997 | Agnello et al. | 438/602 |
| 5,710,438 A | * 1/1998 | Oda et al. | 257/69 |
| 5,904,564 A | 5/1999 | Park | 438/683 |
| 5,915,197 A | 6/1999 | Yamanaka et al. | 438/586 |
| 6,008,111 A | * 12/1999 | Fushida et al. | 438/584 |
| 6,025,267 A | * 2/2000 | Pey et al. | 438/656 |
| 6,037,204 A | * 3/2000 | Chang et al. | 438/231 |
| 6,096,647 A | * 8/2000 | Yang et al. | 438/682 |
| 6,159,856 A | * 12/2000 | Nagano | 438/683 |
| 6,207,563 B1 | 3/2001 | Wieczorek et al. | 438/664 |
| 6,242,348 B1 | 6/2001 | Kamal et al. | 438/682 |
| 2001/0049194 A1 | * 12/2001 | Oda | 438/682 |
| 2002/0061639 A1 | * 5/2002 | Itonaga | 438/592 |

OTHER PUBLICATIONS

S. Shimuzu et al., "Advanced Ion Implantation and Rapid Thermal Annealing Technologies for Highly Reliable 0.25 um Dual Gate CMOS," IEEE 1996 Symposium on VLSI Technology Digest Technical Papers, Jun. 1996, pp. 64–65.*

* cited by examiner

*Primary Examiner*—Carl Whitehead, Jr.
*Assistant Examiner*—Stephen W. Smoot
(74) *Attorney, Agent, or Firm*—George O. Saile; Stephen B. Ackerman

(57) ABSTRACT

A new processing sequence is provided for the process of creating salicided layers of $CoSi_x$. A conventional gate electrode is formed up to the point where the process of salicidation has to be performed. At that time a layer of cobalt is deposited over the surface of the gate electrode, a first anneal is applied to the deposited layer of cobalt. The layer of cobalt is then selectively etched to formed the contact surfaces of the gate electrode after which, significantly and as a major deviation from previous methods of creating a salicided layer of $CoSi_x$, silicon is implanted into the surface of the created layer of $CoSi_x$. This silicon implant relieves a silicon deficiency into the first annealed layer of $CoSi_x$, this silicon deficiency has experimentally been determined as being the essential cause for the occurrence of Co—Si agglomeration after a second thermal anneal. After the silicon implantation has been completed, a second thermal anneal is applied to the created layer of $CoSi_x$. The occurrence of Co—Si agglomeration is in this manner essentially eliminated.

25 Claims, 3 Drawing Sheets

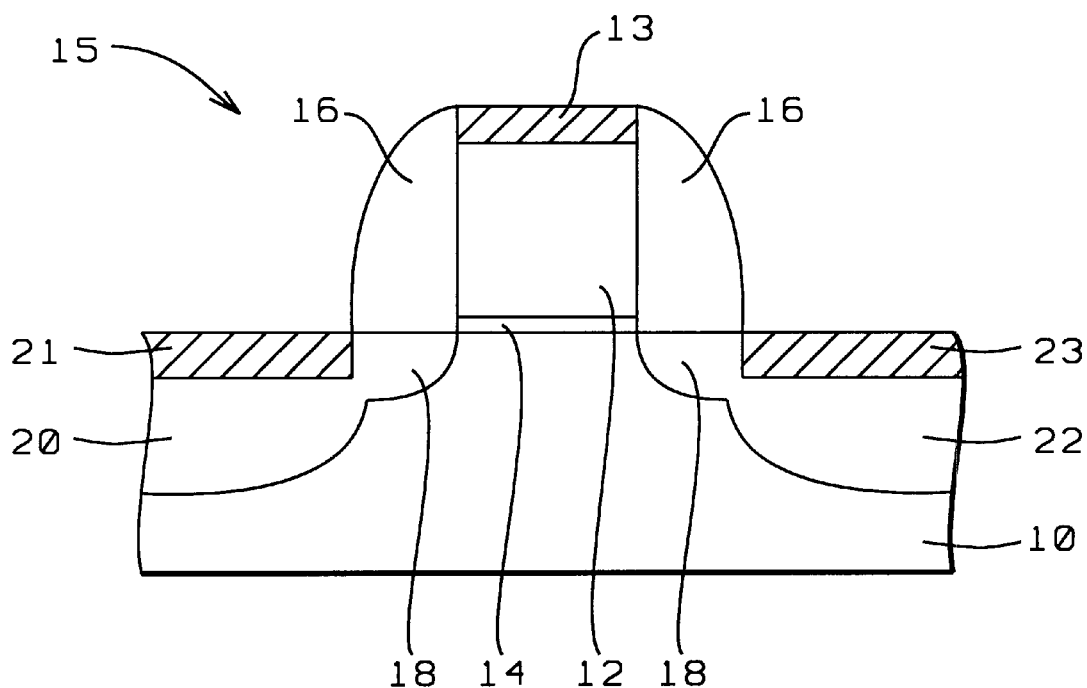
FIG. 1 – Prior Art
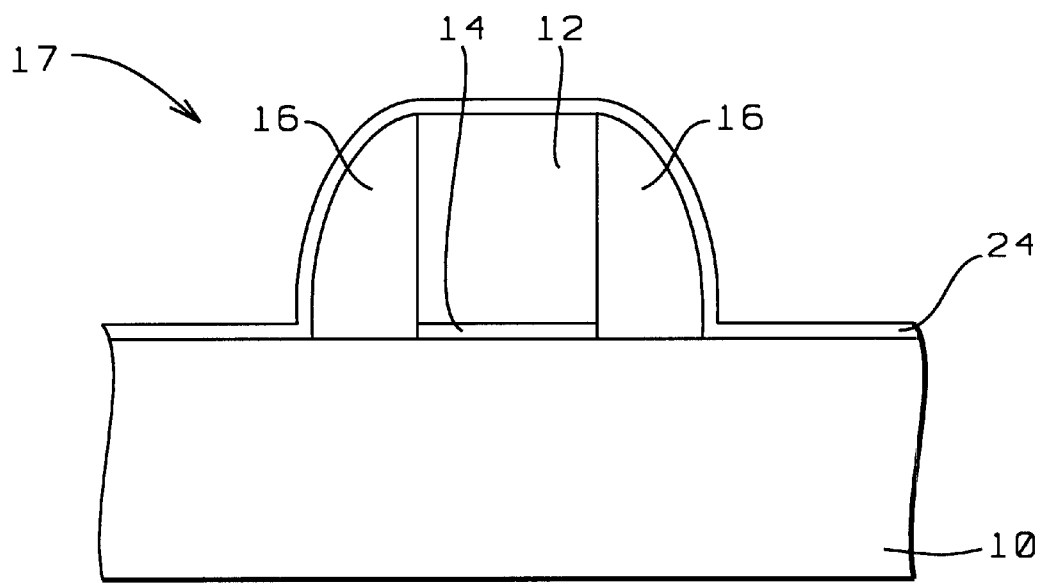
FIG. 2

SILICON IMPLANT IN A SALICIDED COBALT LAYER TO REDUCE COBALT-SILICON AGGLOMERATION

BACKGROUND OF THE INVENTION (1) Field of the Invention

The invention relates to the fabrication of integrated circuit devices, and more particularly, to a method for preventing the accumulation or agglomeration of silicon-cobalt deposits after a Rapid Thermal Heating process during the creation of salicided surfaces.

(2) Description of the Prior Art

The creation of semiconductor devices frequently uses implantation of impurities into a semiconductor surface, typically the surface of a silicon monocrystalline substrate. The implantation of impurities into the surface of a silicon substrate is aimed at changing the conductive properties of the implanted surface by creating well-known impurity regions that form an integral part of a functional semiconductor device. As examples of such regions of impurity implantations can be cited well regions over which for instance Complementary Metal Oxide Semiconductor (CMOS) gate electrodes are created, Lightly Doped Drain (LDD) regions and source/drain regions that form a functional part of the CMOS devices. In addition to implantation of impurities into the surface of a semiconductor substrate, impurity implantation is used to control a desired level of conductivity in the gate layer of the gate electrode that forms the CMOS device.

After a semiconductor device such as a CMOS device has been created, electrical access to the device must be provided. This electrical contact must, for reasons of device performance, among other requirements be a low-resistivity contact. The process of salicidation is well known in the art, typical salicided layers can be formed comprising titanium silicide ($TiSi_2$), nickel silicided (NiSi), nickel alloy silicide (Ni(metal)Si) and cobalt silicide ($CoSi_x$).

The method of self-aligned silicide (salicide) formation, which self-registers with the contacts at the top of the polysilicon gate, the source and the drain, solves the problem of critical dimension tolerance. Salicides have thus become almost universal in high-density CMOS devices even though the gate metal is now frequently replaced by the polysilicon gate. There are, however, problems associated with prior art methods of salicide formation. One main problem is that the salicidation process of converting a refractory metal to its silicide is achieved by the consumption of silicon underlying the metal, and this means the consumption of substrate silicon in the regions of the source and drain. The source/drain junctions, already very shallow in sub-half-micron devices, can become unpredictably extremely thin. A further and very severe problem is that the salicidation reaction can consume substrate silicon unevenly, leading to ragged source/drain junctions and, even worse, the creation of spikes that can penetrate through the junctions near the edges of the source/drain areas.

Another problem that is experienced when forming a $CoSi_x$ layer of salicided material is that concentrations or agglomerations of $CoSi_x$ will appear in the surface of the created salicided layer. It has been experimentally determined that the reason for the appearance of $CoSi_x$ agglomerations is that an insufficient concentration of silicon (Si) is present in the created layer of $CoSi_x$. This insufficiency of Si concentration becomes apparent during steps of thermal anneal that are typically performed after the layer of cobalt has been deposited and selectively etched. The invention addresses this issue and provides a method whereby the insufficiency of Si that is characteristic of the created layer of $CoSi_x$ is removed, thereby removing the occurrence of Co—Si agglomerations.

U.S. Pat. No. 6,242,348 (Kamal et al.) shows a silicide process using an implant.

U.S. Pat. No. 6,207,563 (Wieczorek et al.) shows a two-step anneal in a silicide process.

U.S. Pat. No. 5,904,564 (Park) reveals a CoSix process.

U.S. Pat. No. 5,624,869 (Agnello et al.) and U.S. Pat. No. 5,915,197 (Yamanaka et al.) are related silicide patents.

SUMMARY OF THE INVENTION

A principle objective of the invention is to provide a method that prevents agglomeration of Co—Si in created layers of cobalt salicided material.

In accordance with the objectives of the invention a new processing sequence is provided for creating salicided layers of $CoSi_x$. A conventional gate electrode is formed up to the point where the process of salicidation has to be performed. At that time a layer of cobalt is deposited over the surface of the gate electrode, a first anneal is applied to the deposited layer of cobalt. The layer of cobalt is then selectively etched to form the contact surfaces of the gate electrode after which, significantly and as a major deviation from previous methods of creating a salicided layer of $CoSi_x$, silicon is implanted into the surface of the created layer of $CoSi_x$. This silicon implant relieves a silicon deficiency in the first annealed layer of $CoSi_x$, this silicon deficiency has experimentally been determined as being the essential cause for the occurrence of Co—Si agglomeration after a second thermal anneal. After the silicon implantation has been completed, a second thermal anneal is applied to the created layer of $CoSi_x$. The occurrence of Co—Si agglomeration is in this manner essentially eliminated.

BRIEF DESCRIPTION OF THE DRAWINGS

FIG. 1 shows a cross section of a conventional gate electrode.

FIG. 2 shows a cross section of a gate electrode over the surface of which a layer of cobalt has been deposited.

DESCRIPTION OF THE PREFERRED EMBODIMENTS

Figure 3:
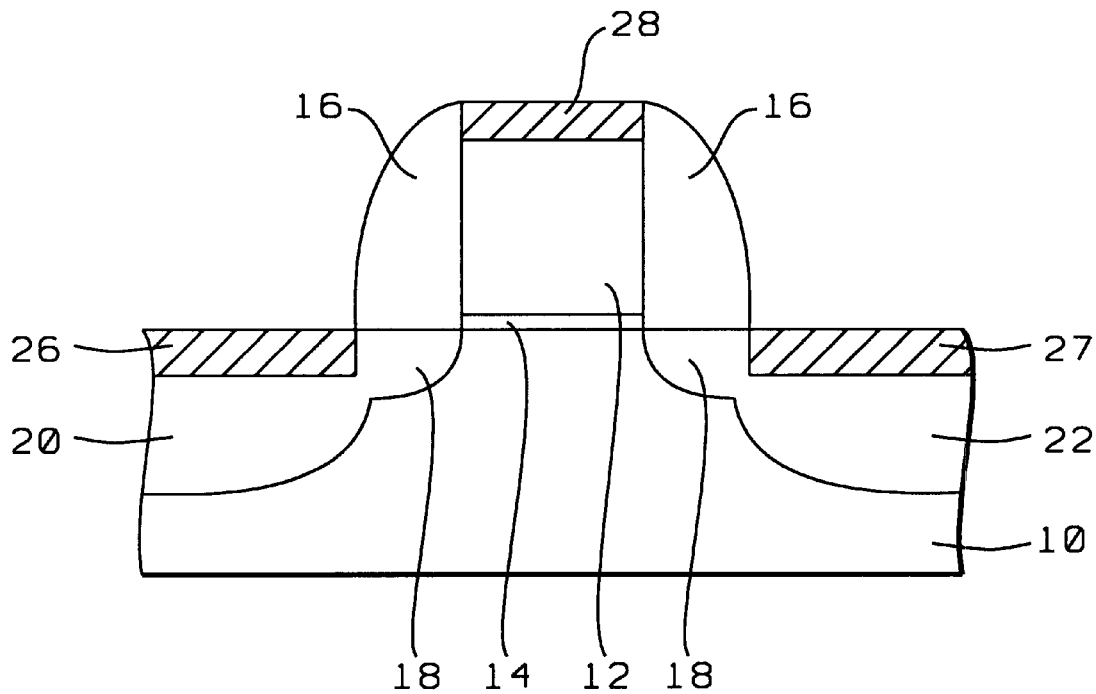
FIG. 3 shows a cross section of a gate electrode after the deposited layer of cobalt has been silicided by applying a first Rapid Thermal Anneal, forming salicided layers of metal over the surface of the contact areas of the gate electrode; unreacted cobalt has been removed from the surface by applying a selective etch of the unreacted cobalt.

The conventional method for creating a CMOS gate electrode structure will first briefly be reviewed for purposes of reference. Shown in the cross section of FIG. 1 is a prior art gate electrode, the following elements are highlighted in the cross section of FIG. 1:

10, the surface of a silicon semiconductor substrate over which the gate electrode 15 has been created 12, the gate layer of the gate electrode 14, a thin layer of gate oxide that serves as an interface between the gate layer 12 and the underlying substrate 10

16, gate spacers formed over the sidewalls of gate layer 12 of the gate electrode 15

18, LDD impurity implants into the surface of substrate 10, self-aligned with the gate layer 12 of the gate electrode 15

20, the source impurity implant into the surface of substrate 10, self-aligned with the gate spacers 16 of the gate electrode 15

22, the drain impurity implant into the surface of substrate 10, self-aligned with the gate spacers 16 of the gate electrode 15

13, the salicided surface of the gate layer 12, forming the contact point of the gate layer 12 of gate electrode 15

21, the salicided surface layer and source region contact point of the gate electrode 15

23, the salicided surface layer and drain region contact point of the gate electrode 15.

The materials that are used and the processing steps and processing conditions that are applied for the creation of the gate electrode 15 that is shown in cross section in FIG. 1 are well known in the art and will therefore not be further highlighted at this time.

The invention addresses the creation of a CMOS device, of which 15 is the gate electrode structure, whereby the conductivity of the gate layer 12, typically comprising polysilicon, is determined by boron implantation into the layer 12. This implies that the gate electrode 15 is a PMOS device, created over an n-well (not shown) in the surface of substrate 10 while further performing p-type impurity implantations for source and drain regions 20 and 22 and for LDD regions 18. The salicided surfaces that have been highlighted as regions 21, 23 and 13 are further assumed to have been created by depositing a layer of cobalt over the structure and by then applying a first and a second anneal to this deposited layer of cobalt, creating layers of $CoSi_x$ for surfaces 21, 23 and 13.

The conventional steps that are performed for the creation of the gate electrode that is shown in cross section in FIG. 1 can therefore be summarized as follows:

creating the gate electrode (15), including the gate spacers (16) and the layer (14) of gate oxide underlying the gate layer (12) of the gate electrode, including impurity implantations (18, 20 and 22) into the surface of the substrate (10) over which the gate electrode (15) is created, including providing the desired conductivity of the gate layer (12) by impurity implantations into the gate layer depositing a layer of cobalt over the surface of the created gate electrode, including the surface of the created source/drain regions of the gate electrode performing a first Rapid Thermal anneal of the deposited layer of cobalt, creating layers of salicided cobalt over the contact surfaces of the gate electrode removing the unreacted cobalt from the surface of the (gate spacers) of the gate electrode and from the surface of the substrate by applying a selective etch of this unreacted cobalt, and performing a second Rapid Thermal anneal of the deposited layer of cobalt, creating low-resistivity layers of salicided cobalt.

The essential problem that arises in following the method that is highlighted above and using the cross section of FIG. 1 is the occurrence of Co—Si agglomerations and "grooving" of the created $CoSi_x$ layer along polysilicon grain boundaries in the boron-doped polysilicon gate layer 12. Where a borofluoride ($BF_2$) implantation is used for the control of the conductivity of the gate layer 12 and the source/drain regions 20/22 of the gate electrode, it has been found that the fluoride (F) elements that is present in the $BF_2$ is the cause for insufficient levels of Si to be present in the created layer of $CoSi_x$ after completion of the first thermal anneal. This insufficiency of Si in the created layer of $CoSi_x$ leads to the indicated occurrence of Co—Si agglomeration after the second thermal anneal is applied to the created layer of $CoSi_x$.

The instant invention provides for forming a boron-doped silicon gate layer, comprising either amorphous silicon or polysilicon, over which a layer of $CoSi_x$ is formed, layers of $CoSi_x$ are also formed over the source and drain regions of the PMOS gate electrode. The process of the invention therefore starts, see FIG. 2, with a gate electrode structure 17 formed over a n-well in the surface of a silicon substrate (not shown), a gate oxide layer 14 has been created underlying the gate electrode layer 12, gate spacers 16 have been provide over sidewalls of the gate electrode layer 12.

Gate spacers 16 can be formed by depositing for instance silicon-nitride or silicon-oxide or a combination thereof over the surface of the gate electrode layer 12. As an example, silicon oxide gate spacers can be formed via anisotropic RIE of a deposited layer of silicon oxide, using $CHF_3$ or $CF_4$—$O_2$—He as an etchant. Other spacer materials that can be applied are BSG, PSG, polysilicon, materials preferably of a dielectric nature, CVD oxide formed from a TEOS source. Often used are amorphous materials that inhibit the deposition of epitaxial silicon thereupon. Gate spacers 16 typically have a width of between about 500 and 1,000 Angstrom along the interface between the gate spacers 16 and the underlying silicon surface 10.

The invention deposits a layer 24 of cobalt over the surface of the gate electrode structure 17. The deposited layer 24 of cobalt completely covers the surface of the n-well created in the silicon substrate 10, the silicon based gate layer 12 and the exposed surface of the gate spacers 16, as shown in the cross section of FIG. 2. The layer 24 of cobalt can be deposited to a thickness between about 30 to 300 $A^0$ at a temperature of 25 to 500 degrees C. using either rf. sputtering or CVD techniques.

The PMOS gate electrode structure 17 and the cobalt layer 24 are then subjected to a first thermal treatment at, for example, a temperature between about 480 and 520 degrees C. for a time between 20 and 100 seconds, in a nitrogen ($N_2$) environment. The first thermal anneal converts the deposited layer of cobalt into $CoSi_x$ by stimulating interaction between the deposited layer 24 of cobalt and the underlying silicon of the silicon substrate 10 or the silicon of gate electrode layer 12.

After the first thermal anneal has been completed, unreacted cobalt is removed from above the exposed surface of substrate 10 and from the gate spacers of the gate electrode by applying a selective etch to the unreacted cobalt, using a conventional selective wet etch, such as a 2:3 mixture of phosphoric acid ($H_3PO_4$) and hydrogen peroxide ($H_2O_2$), applied for a period of between about 15 and 25 minutes.

The cross section that is shown in FIG. 3 shows the structure that has been created up to this point. Self-aligned layers of $CoSi_x$ have been formed in this manner, specifically layer 26 over the surface of the source region 20, layer 27 over the surface of the drain region 22 and layer 28 over the surface of the gate layer 12.

Figure 4:
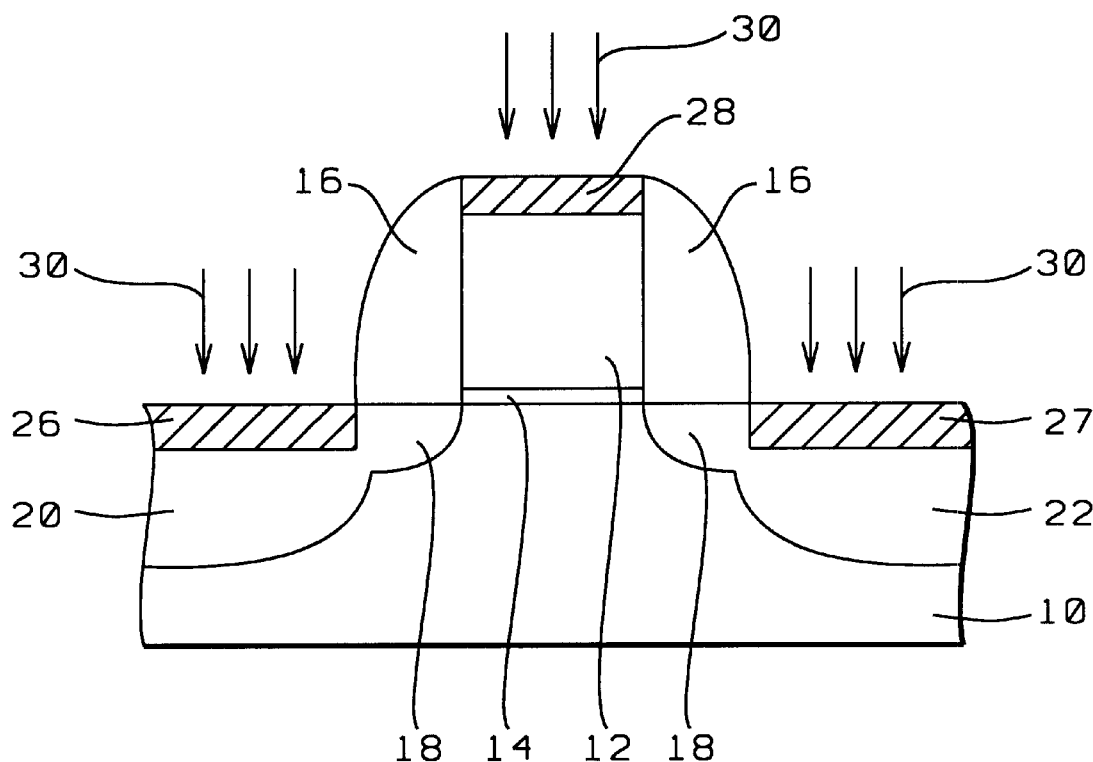
FIG. 4 shows a cross section of the gate electrode during silicon implantation.

Next, silicon ions are implanted by a silicon implantation 30, FIG. 4, performed into the surface of the gate electrode structure 28/12/14 and into the surface of salicided layers 26 and 27 and into the surface of the underlying silicon substrate 10. The silicon can typically be performed using an implant concentration of between about 1E15 and 6E15 ions/cm$^2$ at an implant energy of between about 40 and 50 KeV. This kind of an implant represents a heavily doped implant, the implant concentration and implantation energy can be adjusted and can be selected based on the desired depth of penetration and concentration of implanted ions. Care has to be taken in this respect that these latter implantation parameters are selected such that the implanted ions do not penetrate through the gate electrode layer 12 in which case potential damage could be inflicted on the underlying thin layer 14 of gate oxide. Since layer 14 of gate oxide is, for reasons of device performance, kept purposely as thin as possible, this layer is easy to damage making a highlighted concern a major consideration in selecting processing parameters for the implantation 30.

The implantation parameters that have been provided above may have to be further adjusted in order to assure optimum prevention of the occurrence of Co—Si agglomeration in the created layers of CoSi$_x$. If a lesser concentration of silicon implant is employed, the risk of agglomeration in the CoSi$_x$ layer will be increased. The silicon implant energy is to be selected such that the peak concentration of implanted silicon ions in the layers of CoSi$_x$ is located about at or slightly below the interface between layers 26, 27 and 28 and the underlying layer of silicon for optimum results of eliminating the detrimental effect that is introduced by the fluoride component of the implanted BF$_2$. A typical thickness of the deposited layer 24 of borofluoride (BF$_2$) is about 100 Angstrom, this layer will have a thickness as a layer of CoSi$_x$ of about 300 Angstrom after salicidation of the layer of cobalt. For this application, the implant energy is optimally selected such that the highest concentration of the implanted silicon ions is located about 350 Angstrom below the surface of layers 26, 27 and 28.

As a final step of the invention, the structure that is shown in cross section in FIG. 4 is subjected to a second thermal anneal to form the final layers of CoSi$_2$ that are required as layers of contact to the gate electrode structure 17. The second thermal anneal further activates the implanted boron ions, thereby forming a boron doped silicon gate layer underlying the layers of CoSi$_2$.

Figure 5:
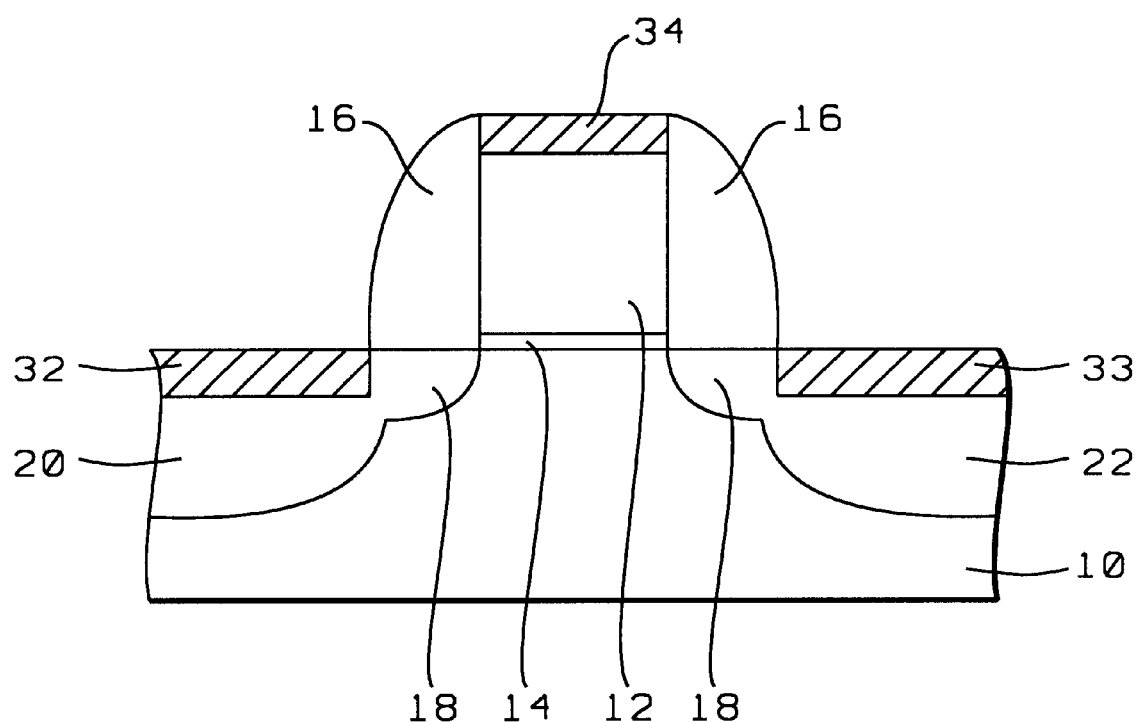
FIG. 5 shows a cross section of the gate electrode of the invention, by applying a second Rapid Thermal Anneal low-resistivity salicided layers have been formed to the contact areas of the gate electrode that are at this time free of Co—Si agglomerations.

The second thermal anneal is a rapid thermal anneal in a temperature range of between about 800 and 900 degrees C. for a time between 20 and 40 seconds in an N$_2$ ambient and converts the layers 26, 27 and 28 to layers 32, 33 and 34, FIG. 5, that are more stable and that have lower sheet resistance.

The processing steps of the invention that are performed for the creation of the gate electrode that is shown in cross section in FIG. 5 can therefore be summarized as follows:

creating the gate electrode (17), including the gate spacers (16) and the layer (14) of gate oxide underlying the gate layer (12) of the gate electrode, including impurity implantations (18, 20 and 22) into the surface of the substrate (10) over which the gate electrode (17) is created, including providing the desired conductivity of the gate layer (12) by impurity implantations into the gate layer depositing a layer of cobalt over the surface of the created gate electrode, including the surface of the created source/drain regions of the gate electrode performing a first Rapid Thermal anneal of the deposited layer of cobalt, creating layers of salicided cobalt over the contact surfaces of the gate electrode removing the unreacted cobalt from the surface of the (gate spacers) of the gate electrode and from the surface of the substrate by applying a selective etch of this unreacted cobalt significantly and in variation with conventional methods of creating a gate electrode structure, performing a silicon implantation into the surfaces of the salicided layers of cobalt, and performing a second Rapid Thermal anneal of the deposited layer of cobalt, creating low-resistivity layers of salicided cobalt.

The above highlighted sequence can be further expanded for the formation of cobalt-silicide by applying this processing sequence to a layer of semiconductor material that contains silicon and creating layer of salicided cobalt over the surface of this layer of semiconductor material. This as follows:

provide a layer of semiconductor material, the semiconductor material comprising silicon, the layer of semiconductor material has been provided with a level of conductivity by doping using boron as a source of impurity implantation, the surface of the layer of semiconductor material is selectively exposed using an exposure mask overlying the layer of semiconductor material, the exposure mask preferably comprising photoresist deposit a layer of cobalt of the surface of the exposure mask and the selectively exposed surface of the layer of semiconductor material apply a first Rapid Thermal anneal to the layers of semiconductor material and the layer of cobalt, creating layers of reacted cobalt overlying the selectively exposed surface of the semiconductor material and layers of unreacted cobalt overlying the exposure mask remove the unreacted cobalt from the surface of the exposure mask perform a silicon implantation into the surface of the layers of reacted cobalt, and apply a second Rapid Thermal anneal to the layers of reacted cobalt.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the formation of salicided contact regions of a gate electrode structure, comprising the steps of:

providing a substrate, said substrate having been provided with at least one partially completed gate electrode structure over the surface thereof, said at least one partially completed gate electrode comprising a layer of gate oxide over which a gate layer has been created, gate spacers having been provided over sidewalls of said gate layer, impurity implantations for said at least one partially completed gate electrode having been provided into the surface of said substrate;

depositing a layer of cobalt over the surface of said at least one partially completed gate electrode, including the surface of said substrate into which said impurity implantations for said at least one partially completed gate electrode have been provided;

performing a first rapid thermal anneal of said deposited layer of cobalt, creating layers of reacted and unreacted cobalt over the surface of said substrate and the surface of said at least one partially completed gate electrode;

removing said unreacted layer of cobalt from the surface of said substrate and the surface of said at least one partially completed gate electrode;

performing a silicon implantation into the surface of said reacted layers of cobalt, said performing a silicon implantation into the surface of said reacted layers of cobalt providing silicon ions with a concentration having a maximum value that is located below the layers of reacted cobalt at a measurable distance; and performing a second rapid thermal anneal of said reacted layers of cobalt.

2. The method of claim 1, said at least one partially completed gate electrode structure over the surface thereof comprising a Positive Metal Oxide Semiconductor (PMOS) device.

3. The method of claim 1, said gate layer provided for said at least one partially completed gate electrode comprising a material selected from the group consisting of amorphous silicon and polysilicon.

4. The method of claim 1, said gate layer provided for said at least one partially completed gate electrode having been provided with a conductivity by boron implantation.

5. The method of claim 1, said depositing a layer of cobalt over the surface of said at least one partially completed gate electrode comprising depositing a layer of cobalt to a thickness between about 30 and 300 Angstroms.

6. The method of claim 1, said performing a first rapid thermal anneal of said deposited layer of cobalt comprising applying a temperature between about 480 and 520 degrees C. for a time between 20 and 100 seconds, in a nitrogen ($N_2$) environment.

7. The method of claim 1, wherein said removing said unreacted layer of cobalt comprises applying a selective wet etch using a 2:3 mixture of phosphoric acid ($H_3PO_4$) and hydrogen peroxide ($H_2O_2$), applied for a period of between about 15 and 25 minutes.

8. The method of claim 1, wherein said performing a silicon implantation into the surface of said reacted layers of cobalt comprises a silicon implantation concentration of between about 1E15 and 6E15 ions/cm$^2$ at a silicon implantation energy of between about 40 and 50 KeV.

9. The method of claim 1, wherein said performing a second rapid thermal anneal of said reacted layers of cobalt comprises applying a temperature of between about 800 and 900 degrees C. for a time between 20 and 40 seconds in an $N_2$ ambient.

10. A method of forming a salicided layer of cobalt, comprising the steps of:

providing a layer of semiconductor material, said semiconductor material comprising silicon, said layer of semiconductor material having been provided with a level of conductivity by doping using boron as a source of impurity implantation, the surface of said layer of semiconductor material being selectively exposed using an exposure mask overlying said layer of semiconductor material;

depositing a layer of cobalt on the surface of said exposure mask and said selectively exposed surface of said layer of semiconductor material;

applying a first Rapid Thermal anneal to the said layer of semiconductor material and said layer of cobalt, creating layers of reacted cobalt overlying said selectively exposed surface of said semiconductor material and layers of unreacted cobalt overlying said exposure mask;

removing said unreacted cobalt from the surface of said exposure mask;

performing a silicon implantation into the surface of said layers of reacted cobalt; and applying a second Rapid Thermal anneal to said layers of reacted cobalt.

11. The method of claim 10, said selectively exposed surface of said layer of semiconductor material comprising contact surfaces of a Positive Metal Oxide Semiconductor (PMOS) device.

12. The method of claim 10, said exposure mask comprising photoresist.

13. The method of claim 10, said depositing a layer of cobalt comprising depositing a layer of cobalt to a thickness between about 30 and 300 Angstroms.

14. The method of claim 10, said applying a first Rapid Thermal Anneal comprising applying a temperature between about 480 and 520 degrees C. for a time between 20 and 100 seconds, in a nitrogen ($N_2$) environment.

15. The method of claim 10, wherein said removing said unreacted cobalt from the surface of said exposure mask comprises applying a selective wet etch using a 2:3 mixture of phosphoric acid ($H_3PO_4$) and hydrogen peroxide ($H_2O_2$), applied for a period of between about 15 and 25 minutes.

16. The method of claim 10, wherein said performing a silicon implantation into the surface of said layers of reacted cobalt comprises a silicon implantation concentration of between about 1E15 and 6E15 ions/cm$^2$ at a silicon implantation energy of between about 40 and 50 KeV.

17. The method of claim 10, said performing a silicon implantation into the surface of said layers of reacted cobalt providing silicon ions with a concentration having a maximum value that is located below the layers of reacted cobalt at a measurable distance.

18. The method of claim 10, wherein said applying a second Rapid Thermal anneal to said layers of reacted cobalt comprises applying a temperature of between about 800 and 900 degrees C. for a time between 20 and 40 seconds in an $N_2$ ambient.

19. A method for the formation of salicided contact regions of a gate electrode structure, comprising the steps of:

providing a substrate, said substrate having been provided with at least one partially completed PMOS gate electrode over the surface thereof, said at least one partially completed PMOS gate electrode comprising a layer of gate oxide over which a gate layer has been created, said gate layer comprising silicon, said gate layer having been provided with a level of conductivity by ion implantation using boron as a source of impurities, gate spacers having been provided over sidewalls of said gate layer, impurity implantations for said at least one partially completed PMOS gate electrode having been provided into the surface of said substrate;

depositing a layer of cobalt over the surface of said at least one partially completed PMOS gate electrode, including the surface of said substrate into which said impurity implantations for said at least one partially completed gate electrode have been provided;

performing a first rapid thermal anneal of said deposited layer of cobalt, creating layers of reacted and unreacted cobalt over the surface of said substrate and the surface of said at least one partially completed PMOS gate electrode;

removing said unreacted layer of cobalt from the surface of said substrate and the surface of said at least one partially completed PMOS gate electrode;

performing a silicon implantation into the surface of said reacted layers of cobalt, said performing a silicon implantation into the surface of said reacted layers of cobalt providing silicon ions with a concentration having a maximum value that is located below the layers of reacted cobalt at a measurable distance; and performing a second rapid thermal anneal of said reacted layers of cobalt.

20. The method of claim 19, said silicon of said gate layer comprising a material selected from the group consisting of amorphous silicon and polysilicon.

21. The method of claim 19, said depositing a layer of cobalt over the surface of said at least one partially completed PMOS gate electrode comprising depositing a layer of cobalt to a thickness between about 30 and 300 Angstroms.

22. The method of claim 19, said performing a first rapid thermal anneal of said deposited layer of cobalt comprising applying a temperature between about 480 and 520 degrees C. for a time between 20 and 100 seconds, in a nitrogen ($N_2$) environment.

23. The method of claim 19, wherein said removing said unreacted layer of cobalt comprises applying a selective wet etch using a 2:3 mixture of phosphoric acid ($H_3PO_4$) and hydrogen peroxide ($H_2O_2$), applied for a period of between about 15 and 25 minutes.

24. The method of claim 19, wherein said performing a silicon implantation into the surface of said reacted layers of cobalt comprises a silicon implantation concentration of between about 1E15 and 6E15 ions/cm$^2$ at a silicon implantation energy of between about 40 and 50 KeV.

25. The method of claim 19, wherein said performing a second rapid thermal anneal of said reacted layers of cobalt comprises applying a temperature of between about 800 and 900 degrees C. for a time between 20 and 40 seconds in an $N_2$ ambient.

* * * * *